United States Patent
Moon et al.

(10) Patent No.: US 11,233,348 B2
(45) Date of Patent: Jan. 25, 2022

(54) STRUCTURAL OPTIMIZATION OF CONTACT GEOMETRY FOR HIGH PERFORMANCE CONNECTOR

(71) Applicant: Intel Corporation, Santa Clara, CA (US)

(72) Inventors: Se-Jung Moon, Portland, OR (US); Chien-Ping Kao, Hummelstown, PA (US); Gaudencio Hernandez Sosa, Guadalajara (MX); Beom-Taek Lee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/857,833

(22) Filed: Apr. 24, 2020

(65) Prior Publication Data
US 2021/0159625 A1    May 27, 2021

(51) Int. Cl.
*H01R 12/73* (2011.01)
*H01R 12/57* (2011.01)
*H01R 12/70* (2011.01)

(52) U.S. Cl.
CPC ........... *H01R 12/737* (2013.01); *H01R 12/57* (2013.01); *H01R 12/7076* (2013.01)

(58) Field of Classification Search
CPC .. H01R 12/737; H01R 12/57; H01R 12/7076; H01R 12/72
USPC .......................................................... 439/62
See application file for complete search history.

(56) References Cited

U.S. PATENT DOCUMENTS

| | | | | |
|---|---|---|---|---|
| 4,955,820 A * | 9/1990 | Yamada | ............... | H05K 3/3426 439/83 |
| 5,052,936 A * | 10/1991 | Biechler | ............... | H01R 12/725 439/60 |
| 5,137,454 A * | 8/1992 | Baechtle | ................ | H01R 12/57 439/267 |
| 5,199,885 A * | 4/1993 | Korsunsky | ........... | H01R 12/737 439/79 |
| 5,419,708 A * | 5/1995 | Koss | ...................... | H05K 1/117 439/59 |
| 5,496,180 A * | 3/1996 | Fabian | ................... | H01R 4/028 439/60 |
| 6,042,386 A * | 3/2000 | Cohen | .................. | H01R 13/502 439/60 |

(Continued)

*Primary Examiner* — Peter G Leigh
(74) *Attorney, Agent, or Firm* — Schwabe, Williamson & Wyatt, P.C.

(57) ABSTRACT

A connector includes a connector housing forming a receptacle configured to receive an add-in card. The connector further includes a first connector pin configured to electrically couple to the add-in card responsive to the add-in card being inserted into the receptacle. The first connector pin extends from the connector housing to contact a first solder pad disposed on a printed circuit board (PCB). The connector further includes a second connector pin configured to electrically couple to the add-in card responsive to the add-in card being inserted into the receptacle. The second connector pin extends from the connector housing to contact a second solder pad disposed on the PCB. The first connector pin is oriented toward the second connector pin to couple to the PCB in a toe-routing configuration and the second connector pin is oriented away from the first connector pin to couple to the PCB in the toe-routing configuration.

17 Claims, 9 Drawing Sheets

(56) References Cited

U.S. PATENT DOCUMENTS

| | | | | |
|---|---|---|---|---|
| 6,152,742 | A * | 11/2000 | Cohen | H01R 13/502 |
| | | | | 439/60 |
| 6,561,850 | B2 * | 5/2003 | Letourneau | H01R 12/714 |
| | | | | 439/108 |
| 7,198,519 | B2 * | 4/2007 | Regnier | H01R 12/725 |
| | | | | 439/637 |
| 7,442,089 | B2 * | 10/2008 | Regnier | H01R 13/26 |
| | | | | 439/637 |
| 7,585,188 | B2 * | 9/2009 | Regnier | H01R 13/41 |
| | | | | 439/637 |
| 7,604,510 | B2 * | 10/2009 | Akama | H01R 13/6585 |
| | | | | 439/637 |
| 7,896,661 | B2 * | 3/2011 | Yao | H01R 12/721 |
| | | | | 439/83 |
| 8,162,671 | B2 * | 4/2012 | Matsubara | H01R 43/16 |
| | | | | 439/60 |
| 8,545,240 | B2 * | 10/2013 | Casher | H01R 13/6585 |
| | | | | 439/108 |
| 8,727,809 | B2 * | 5/2014 | Mongold | H01R 13/6585 |
| | | | | 439/607.14 |
| 9,048,581 | B2 * | 6/2015 | Briant | H01R 13/4361 |
| 9,887,474 | B2 * | 2/2018 | Chien | H01R 12/724 |
| 10,340,620 | B2 * | 7/2019 | Ogura | H01R 13/26 |
| 10,581,206 | B2 * | 3/2020 | Fang | H01R 13/646 |
| 2007/0010125 | A1 * | 1/2007 | Regnier | H01R 13/41 |
| | | | | 439/495 |
| 2019/0044286 | A1 * | 2/2019 | Moon | H01R 13/652 |

* cited by examiner

FIG. 5 ns in a toe-routing configuration, according to certain embodiments.
STRUCTURAL OPTIMIZATION OF CONTACT GEOMETRY FOR HIGH PERFORMANCE CONNECTOR FIG. 1 illustrates a system including an add-in card and a printed circuit board (PCB) coupled by a connector that has connector pins in a toe-routing configuration, according to certain embodiments.

DESCRIPTION OF EMBODIMENTS

Described herein are technologies directed to structural optimization of contact geometry for high performance connector (e.g., for a connector is configured to transmit signals via Peripheral Component Interconnect Express® (PCIe®) protocol, etc.).

A connector, such as a surface mount (SMT) connector, can be used to connect a first component, such as an add-in card, with a second component disposed on a printed circuit board (PCB). Unlike thru-hole mount (THM) connectors, SMT connectors have long pins (e.g., connector pins) that sit on solder pads on the surface of the PCB. A connector pin has an upper portion that is oriented from a connector housing toward the solder pad, a lower portion disposed on the solder pad, and a bend portion disposed between the upper portion and the lower portion (e.g., to make the transition between the upper portion and the lower portion). A microstrip is routed on the PCB from the solder pad to the second component disposed on the PCB. Connector pins of SMT connectors each have a configuration (e.g., a lead-in, a break-out) of a routing direction of toe-routing or heel-routing. The union between the bend portion and the lower portion of the connector pin is proximate a first distal end of the solder pad and the other end of the lower portion of the connector pin (e.g., where the connector pin terminates) is proximate a second distal end of the solder pad. In toe-routing configuration, the microstrip connects to the second distal end of the solder pad proximate to where the connector pin terminates. In heel-routing configuration, the microstrip connects to the first distal end of the solder pad proximate to the union between the bend portion and the lower portion of the connector pin. A pad stub length refers to the length of the portion of the solder pad that is not within the shortest distance a signal would travel from the microstrip to the add-in card. The heel-routing configuration (e.g., heel side lead-in/break-out) has longer pad stub length (e.g., from the bend portion to the second distal end of the solder pad) and the toe-routing configuration (e.g., toe side lead-in/break-out) has a shorter pad stub (e.g., from the bend portion to the first distal end of the solder pad). The longer pad stub length of the heel-routing configuration creates impedance drop and resonating characteristics in performance, which deteriorates the SMT connector signal integrity (SI) performance.

For example, for PCIe® card electromechanical (CEM) specification SMT connector, the solder pad is 2 millimeter (mm) long and 0.7 mm wide. The pad stub length is 0.37 mm for toe-routing configuration (e.g., toe-side routing) and 1.63 mm for heel-routing configuration (e.g., heel-side routing). The insertion loss (IL) at 16 GHz is about 0.84 decibels (dB) for toe-routing configuration and about 4.1 dB for heel-routing configuration, which is not allowable for PCIe Gen5 operations. The PCIe 5.0 CEM specification (e.g., draft Rev0.7 specification) allows only 1.5 dB IL maximum at 16 GHz for the connector.

In SMT connector usage, toe-routing configuration is recommended for high speed input-output (TO) (e.g., (e.g., for a connector configured to transmit signals via PCIe® protocol, etc.).

Conventionally, a left side of an SMT connector has connector pins oriented to the left (e.g., the connector pin bends towards the left, the lower portion extends from the bend portion towards the left) and a right side of the SMT connector has connector pins oriented to the right (e.g., the connector pin bends towards the right, the lower portion extends from the bend portion towards the right). There are two rows of connector pins (e.g., one row of connector pins on the left side and one row of connector pins on the right side). The connector pins in the first row are routed away from the connector pins in the second row and the connector pins in the second row are routed away from the connector pins in the first row.

When connector pins on a side of an SMT connector that is located next to an edge of the PCB (e.g., board edge due to platform/chassis architectures) or next to an obstruction (e.g., microstrips routed on the PCB, components located on the PCB), the connector pins traditionally are prevented from being routed in the toe-routing configuration (e.g., do not have board space sufficient for conventional toe-routing configuration).

In some conventional systems, solder pad size is minimized to reduce pad stub length. This solder pad size reduction can cause an issue in mechanical reliability (e.g., open circuit, short circuit) or durability for shock, vibration, aging, etc.

In some conventional systems, via-in-pad plated over (vippo) is used at the center of the solder pad instead of heel-routing configuration. This increases the PCB cost by about 20% and when the PCB size is large, this cost addition is significant.

The devices, systems, and methods, as disclosed herein, provide structural optimization of contact geometry for connectors, such as high performance connectors configured to transmit signals via one or more of PCIe® protocol, PCI® protocol, Intel Architecture Labs (IAL) protocol, Ethernet protocol, or the like. A connector includes a connector housing forming a receptacle configured to receive a first component, such as an add-in card. The connector further includes a first connector pin and a second connector pin. The first and second connector pins are configured to electrically couple to the first component responsive to the first component being inserted into the receptacle. The first connector pin extends from the connector housing to contact a first solder pad disposed on a PCB and the second connector pin extends from the connector housing to contact a second solder pad disposed on the PCB. The first solder pad is connected to a second component disposed on the PCB via a first microstrip disposed on the PCB and the second solder pad is connected to the second component via a second microstrip disposed on the PCB. The first connector pin is oriented toward the second connector pin to couple to the PCB in a toe-routing configuration and the second connector pin is oriented away from the first connector pin to couple to the PCB in the toe-routing configuration.

The devices and systems disclosed herein have advantages over conventional solutions. The connectors described herein have less impedance drop, better resonating characteristics, and an improved signal integrity (SI) compared to connectors in heel-routing configuration. The connectors described herein are configured to have a significantly improved IL with the lower risk of not complying the specification at high speeds and/or frequencies (e.g., maximum IL is 1.5 dB up to 16 GHz).

The PCIe 5.0 CEM specification (e.g., draft Rev0.7 specification) requires differential insertion loss (DDIL) of [−0.1-0.05625*f] dB for frequencies of up to 16 GHz and [3-0.25*f] dB for frequencies greater than 16 GHz and less than 24 GHz, where f is frequency. The devices and systems disclosed herein comply with the PCIe® 5.0 (e.g., Rev 0.7) specification even when located proximate an edge of the PCB or proximate an obstruction.

The connectors described herein are configured to be disposed proximate an edge of a PCB or an obstacle on the PCB. The connectors described herein avoid the mechanical reliability and durability issues associated with reducing solder pad size. The connectors described herein avoid the increased cost, material, and labor of via-in-pad-over-plated configurations.

Although portions of the present description refer to coupling an add-in card received by the connector housing with a component disposed on the PCB, the present description can be applied to coupling one or more of a flexible attachment, a cable assembly, a PCB, an add-in card, and/or the like. The present description can be applied to coupling two of the same type of component (e.g., two PCBs, two add-in cards, etc.). The present description can be applied to coupling two different types of components (e.g., an add-in card and a component disposed on the PCB, etc.). Although portions of the present description refer to a connector being used for transmitting signals via PCIe® protocol, the connector can be used for transmitting signals via other protocols, such as PCI®, Ethernet, IAL, double-data rate (DDR) memory interface, or the like.

Figure 1:
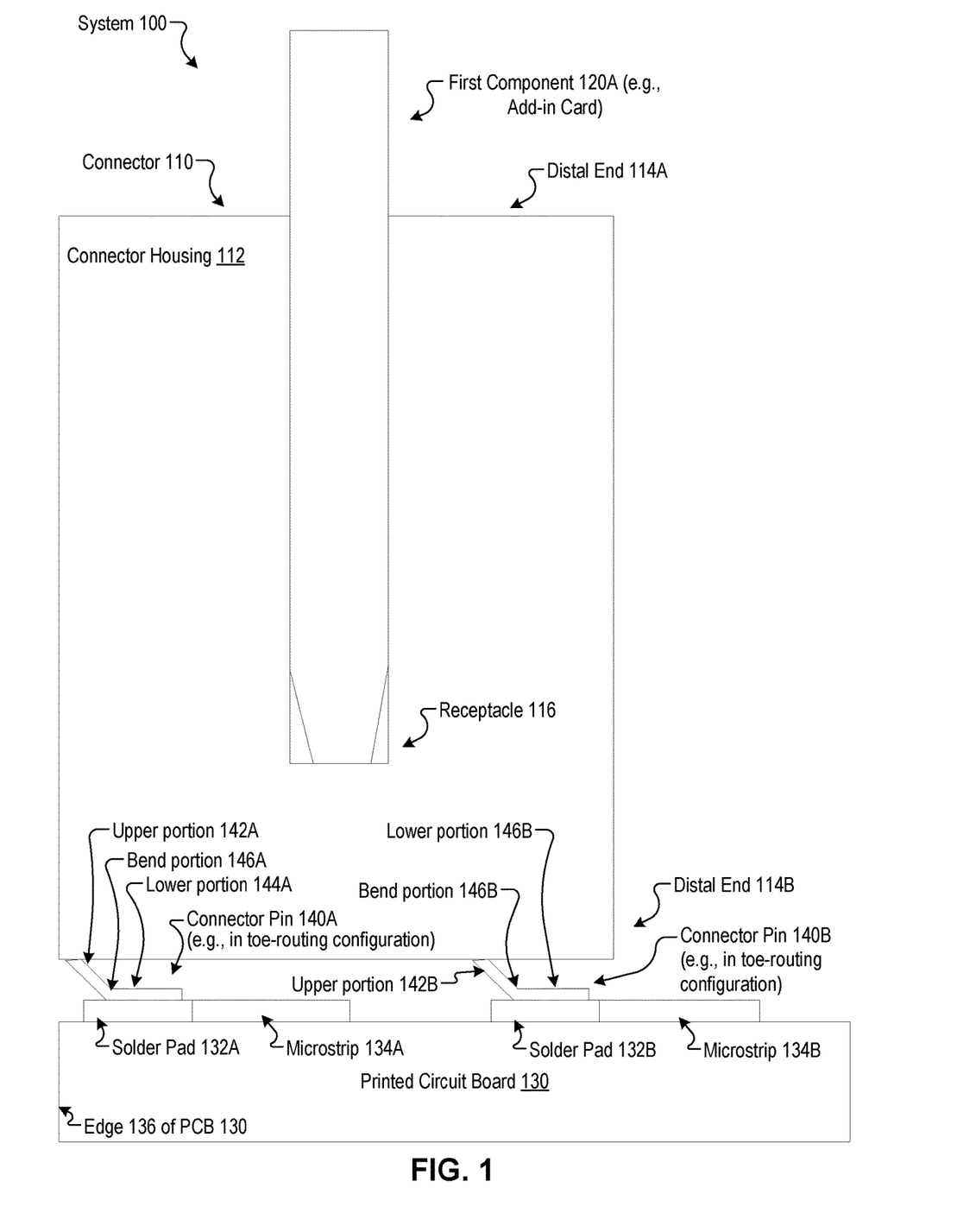

FIG. 1 illustrates a system 100 including a connector 110 (e.g., interconnect assembly, SMT PCIe® Gen4 CEM connector, SMT PCIe® Gen5 CEM connector, etc.), according to certain embodiments.

The connector 110 includes a connector housing 112 that includes a first distal end 114A and a second distal end 114B. In some embodiments, the first distal end 114A is configured to couple to a first component 120A and the second distal end 114B is configured to couple to a PCB 130 (e.g., baseboard). In some embodiments, the first distal end 114 forms a receptacle 116 configured to receive the first component 120A. In some embodiments, the first component 120A is one or more of an add-in card, another PCB, a flexible attachment, a cable assembly (e.g., mated to an add-in card), a modem add-in card, graphics card add-in card, random access memory (RAM) add-in card, DDR memory interface, etc.

The connector 110 further includes connector pins 140A-B (hereinafter connector pins 140). The connector pins 140 are configured to electrically couple to the first component 120A (e.g., add-in card) responsive to the first component 120A being inserted into the receptacle 116. The connector pins 140 extend from the connector housing 112 to contact the solder pads 132 disposed on the PCB 130. In some embodiments, each connector pin 140 (e.g., lower portion 144 of connector pin 140) is soldered onto a corresponding solder pad 132. In some embodiments, the connector 110 has two rows of connector pins 140. A first row of connector pins 140 substantially aligns with (e.g., has substantially the same profile as) the connector pin 140A and a second row of connector pins 140 substantially aligns with (e.g., has substantially the same profile as) the connector pin 140B.

In some embodiments, the first component 120A has contact pads (e.g., goldfinger pads) that electrically couple to (e.g., directly contact, indirectly contact) the connector pins 140 (e.g., each connector pin 140 contacts a distinct contact pad of the first component 120A). In some embodiments, a connector pin 140 extends from the receptacle 116 of the connector 110 to a solder pad 132 of the PCB 130. In some embodiments, one or more conductive components are disposed between the connector pin 140 and the receptacle 116 to electrically couple the connector pin 140 to the first component 120A without the connector pin 140 and first component 120A directly contacting each other.

Each connector pin 140 includes an upper portion 142 that is oriented from the connector housing 112 (e.g., from the receptacle 116) towards a solder pad 132, a lower portion 144 that is disposed on the solder pad 132, and a bend portion 146 that is disposed between the upper portion 142 and the lower portion 144.

Each of the connector pins 140 of the connector 110 are in toe-routing configuration (e.g., even when the connector 110 is located at the edge of PCB 130 or proximate an obstruction). In toe-routing configuration, the lower portion 144 of the connector pin 140 extends from a first location (e.g., union of the bend portion 146 and the lower portion 144) proximate a first distal end of the solder pad 132 to a second location (e.g., end of the connector pin 140) proximate a second distal end of the solder pad 132. A microstrip 134 (e.g., conductor disposed on the PCB 130, microstrip line) contacts the solder pad 132 proximate the second distal end of the solder pad 132 (e.g., proximate the end of the connector pin 140). The microstrip 134 is routed to a second component associated with (e.g., disposed on) the PCB 130. In some embodiments, the second component is a processor, a computer processing unit (CPU), graphics processing unit (GPU), an end point device, or other component. In some embodiments, at least one set (e.g., differential pair, lane, link, etc.) of connector pins 140 is coupled to a second component 120B via a pair of microstrips 134.

In some embodiments, two connector pins 140A that are in the first row provide a first differential pair and two connector pins 140B that are in the second row provide a second differential pair. The first differential pair provides a first lane and the second differential pair provides a second lane. In some embodiments, a link includes the first lane and second lane. In some embodiments, a link includes one, two, four, eighteen, etc. lanes. In some embodiments, on both sides of each differential pair is a corresponding ground contact pin.

In some embodiments, the second component 120B (e.g., CPU) contacts the microstrip 134, the microstrip contacts the solder pad 132, the solder pad 132 contacts (e.g., is soldered to) a connector pin 140, and the connector pin 140 contacts the first component 120A (e.g., add-in card). In some embodiments, a reference layer (e.g., ground layer, etc.) is disposed under one or more of the solder pads 132, the microstrip, or the like (e.g., the reference layer is disposed in or on the PCB 130).

By being in toe-routing configuration, the connector pins 140 have less impedance drop, better resonating characteristics, and an improved signal integrity (SI) compared to connectors in heel-routing configuration. The solder pads 132 have a mechanical reliability and durability associated with toe-routing configuration (e.g., associated with not reducing the solder pad 132 size for heel-routed configuration). By being in toe-routing configuration, the connector pins 140 have an insertion loss (IL) that meets specification (e.g., maximum IL is 1.5 dB up to 16 GHz). By being in toe-routing configuration, the connector pins 140 can be used for one or more of high-speed IO channel signaling, transmitting signals via PCIe® protocol, transmitting signals via PCI® protocol, transmitting signals via Ethernet protocol, transmitting signals via IAL protocol, etc. (e.g., and still be within specification).

The connector pin 140A is oriented towards the connector pin 140B to couple to the PCB 130 (e.g., attach to the solder pad 132A on the PCB 130) in a toe-routing configuration. In some embodiments, the connector pin 140A is bent towards the connector pin 140B. In some embodiments, the lower portion 144 of the connector pin 140A extends towards the connector pin 140B. In some embodiments, the distance between the end of the connector pin 140A on the pad 132A and the connector pin 140B is shorter than the distance between the bend portion 146 of the connector pin 140A and the connector pin 140B. In some embodiments, the microstrip 134A extends from the solder pad 132A towards the solder pad 132B.

The connector pin 140B is oriented away from the connector pin 140A to couple to the PCB 130 (e.g., attach to the solder pad 132B on the PCB 130) in a toe-routing configuration. In some embodiments, the connector pin 140B is bent away from the connector pin 140A. In some embodiments, the lower portion 144 of the connector pin 140B extends away from the connector pin 140A. In some embodiments, the distance between the bend portion of the connector pin 140B and the connector pin 140A is shorter than the distance between the end of the connector pin 140B on the solder pad 132B and the connector pin 140A. In some embodiments, the microstrip 134B extends from the solder pad 132B away from the solder pad 132A.

In some embodiments, the solder pad 132A (and connector 110) is disposed proximate an edge 136 of the PCB 130 or an obstruction (e.g., microstrip, component, etc.). In some embodiments, a connector 110 with a toe-routing configuration, as described herein, is used to optimize (e.g., shorten) microstrip 134 routing (e.g., with or without being proximate to an edge of the PCB 130 or an obstruction). In some examples, the connector pins 140 being routed in the same direction in toe-routing configuration have shorter microstrip lengths than connector pins being routed in opposite directions in toe-routing configuration. In some embodiments, a connector 110 with a toe-routing configuration, as described herein, provides more freedom for platform design.

Figure 2A:
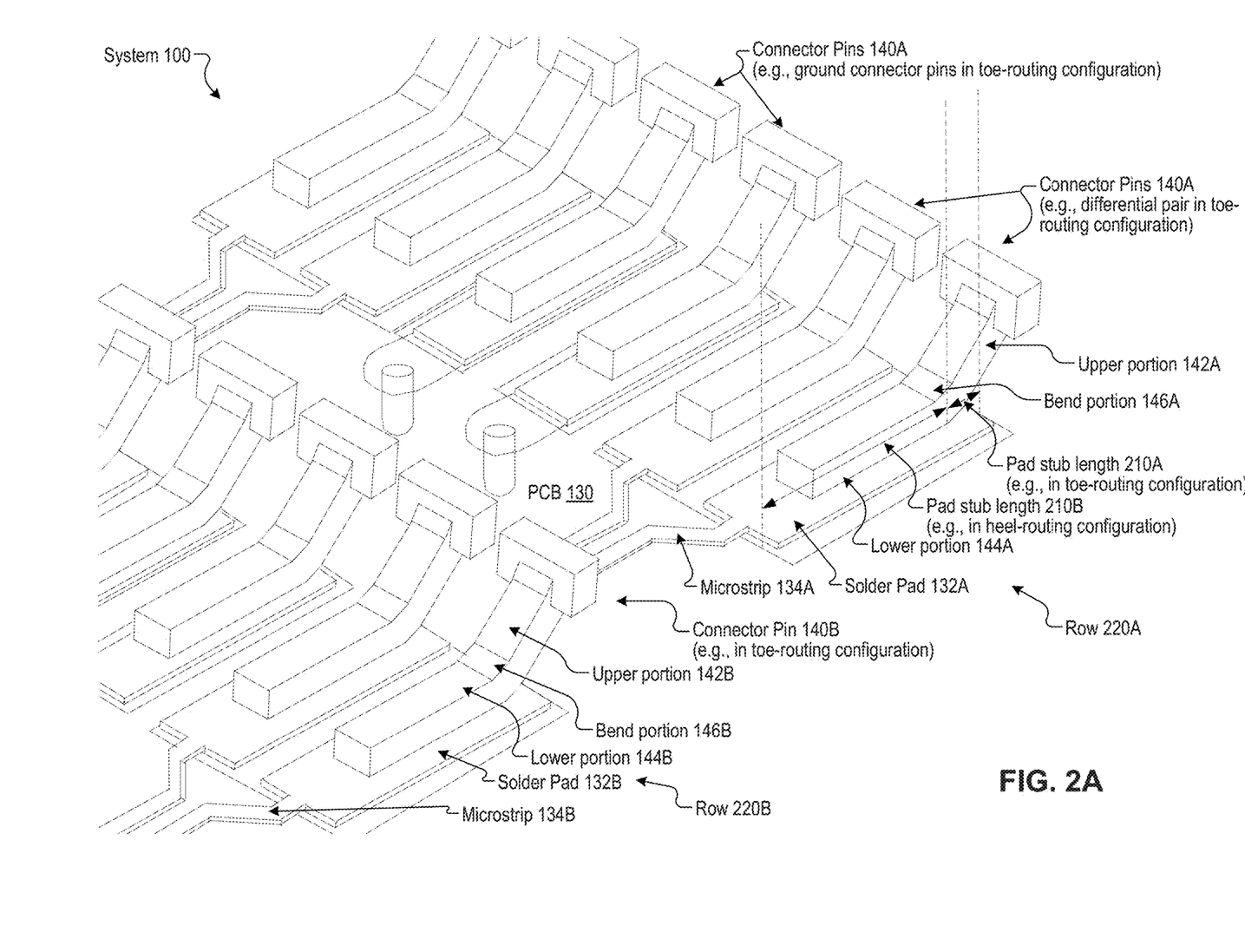
FIG. 2A illustrates a perspective view of connector pins of a connector in a toe-routing configuration, according to certain embodiments.

FIG. 2A illustrates a perspective view of the connector pins 140 of a connector 110 of a system 200A (e.g., system 100 of FIG. 1), according to certain embodiments. In some embodiments, the connector pins 140 are disposed in two rows. For example, FIG. 2A illustrates a row 220A of connector pins 140 including connector pin 140A and a row 220B of connector pins 140 including connector pin 140B. Each row 220 corresponds to a different side of the connector 110. In some embodiments, a first differential pair of connector pins 140A from row 220A and a second differential pair of connector pins 140B from row 220B are configured to couple the first component 120A (e.g., add-in card) to a corresponding second component 120B associated with (e.g., disposed on) the PCB 130. In some embodiments, a different sets of differential pairs of connector pins 140 couple the first component 120A to different components 120B. In some embodiments, multiple sets of differential pairs of connector pins 140 couple the first component 120A to the same component 120B. In some embodiments, a ground connector pin is located next to each differential pair of connector pins.

Each connector pin 140 has an upper portion 142 oriented from the connector housing (not shown) toward a solder pad 132, a lower portion 144 disposed on the solder pad 132, and a bend portion 146 disposed between the upper portion 142 and the lower portion 144. In some embodiments, the upper portion 142, lower portion 144, and the bend portion 146 make up one integral piece.

The solder pad 132 is connected to a microstrip 134 disposed on the PCB 130. Conventionally, when the solder pad 132 (e.g., connector 110) is located proximate an edge of the PCB 130 and/or an obstruction, the connector pin is routed in a heel-routing configuration. A pad stub length 210 refers to the length of the portion of the solder pad 132 that is not within the shortest distance (e.g., fastest route) a signal would travel from the microstrip 134 to a component (e.g., add-in card) inserted into the receptacle of the connector housing of the connector. The pad stub length is past the shortest signal distance and creates vibration, noise, resonance, and/or cavity effect when it is longer than a threshold amount.

The pad stub length 210A (e.g., the length of the solder pad 132 through which the signal does not travel) in toe-routing configuration is much shorter than the pad stub length 210B in heel-routing configuration. In some embodiments, a solder pad 132 is about 2 mm long and about 0.7 mm wide with a pad stub length 210A less than 0.4 mm (e.g., 0.37 mm, 0.3556 mm, 14 mil (thousandths of an inch)) in toe-routing configuration and a pad stub length 210B of greater than 1.5 mm (e.g., 1.63 mm, 1.778 mm, 70 mil) in heel-routing configuration. In some embodiments, the pad stub length 210B is about 4 to 5 times greater than the pad stub length 210A. The shorter pad stub length 210A of toe-routing configuration avoids the impedance drop, resonating characteristics in performance, and deteriorated SMT connector signal integrity (SI) performance of longer pad stub length 210B of heel-routed configuration.

Each of the connector pins 140 has a contact geometry so that all the connector pins (e.g., contacts, pins) land on the PCB 130 (e.g., solder pads 132) in the same direction. This allows a connector 110 to have optimal performance given that toe-routing configuration is enabled even when the connector 110 (e.g., SMT connector) sits at the edge of the PCB 130 or is otherwise obstructed. This allows structural optimization in SMT contact geometry for high-speed IO channel signaling, such as PCIe® Gen 4, PCIe® Gen 5, IAL, Ethernet, etc. This resolves conflicts in platform design when placing the SMT connector in limited space without sacrificing connector performance and without increasing cost (e.g., PCB cost).

Figure 2B:
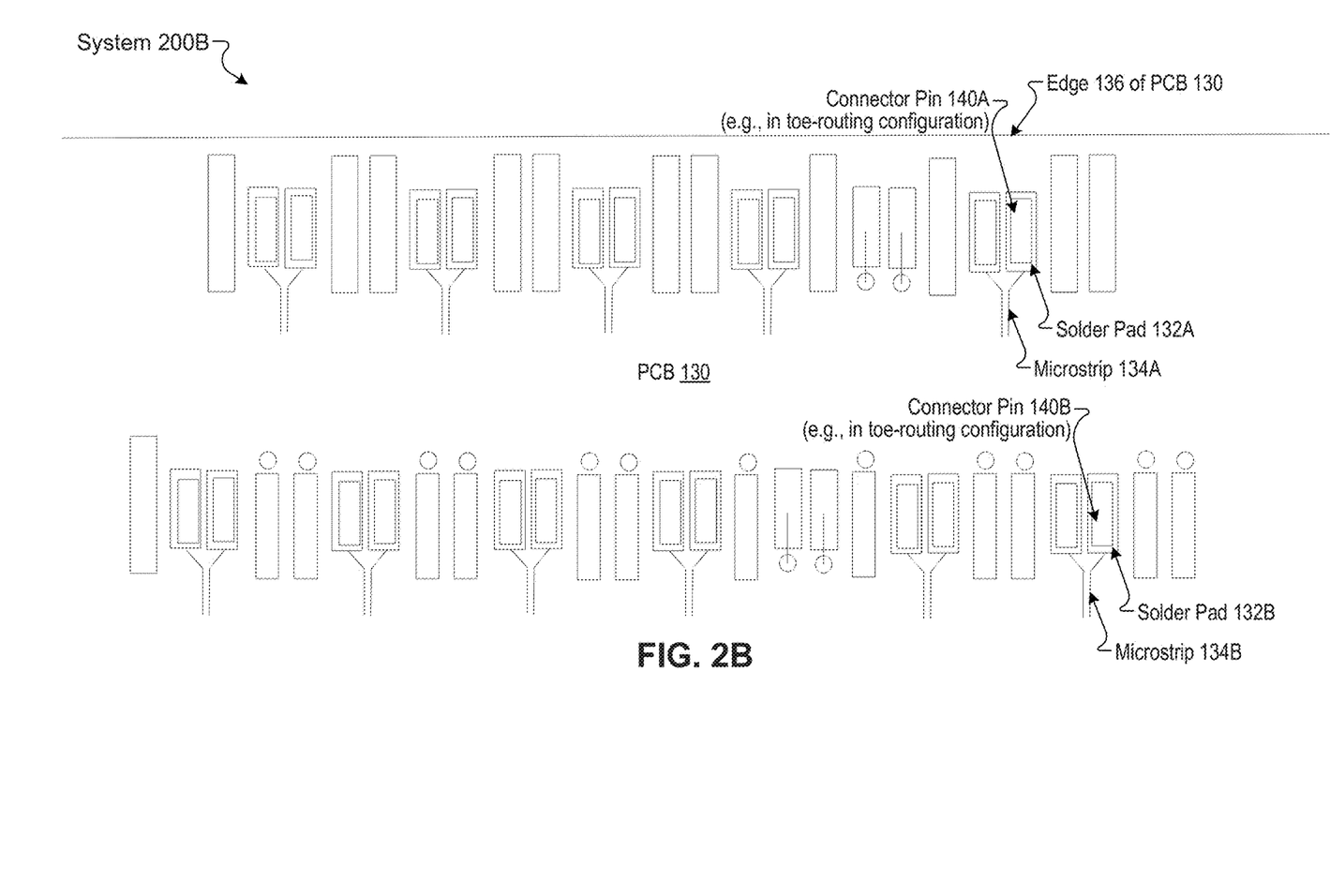
FIG. 2B illustrates a top view of connector pins of a connector in a toe-routing configuration, according to certain embodiments.

FIG. 2B illustrates a top view of the connector pins 140 of a connector 110 of a system 200B (e.g., system 100 of FIG. 1, system 200A of FIG. 2A), according to certain embodiments. Each of the connector pins 140 is in a toe-routing configuration. The microstrip 134A is routed toward the solder pad 132B and the microstrip 134B is routed away from solder pad 132A.

Figures 2C, 2D:
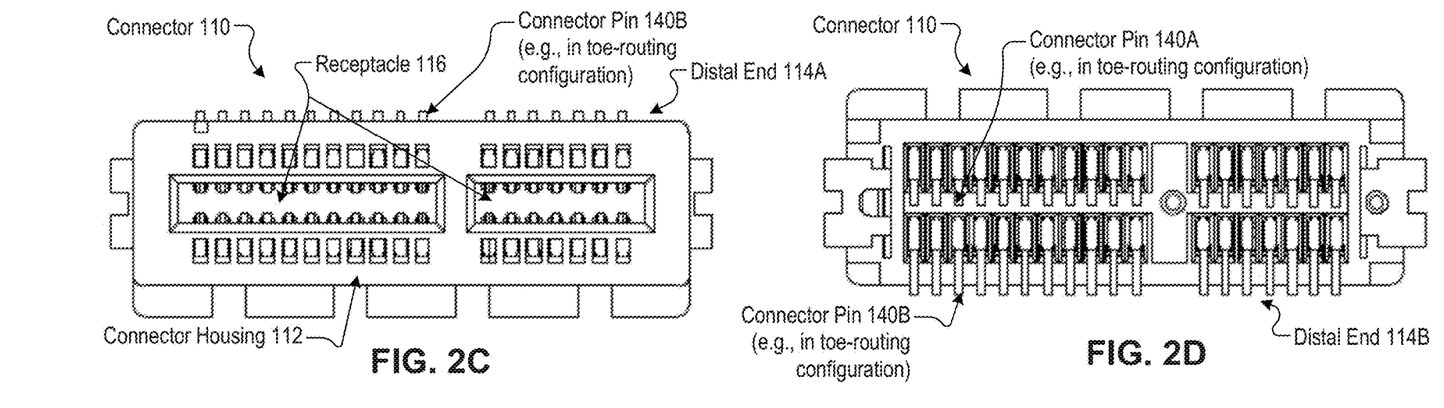
FIG. 2C illustrates a top view of a connector with connector pins in a toe-routing configuration, according to certain embodiments.
FIG. 2D illustrates a bottom view of a connector with connector pins in a toe-routing configuration, according to certain embodiments.

FIG. 2C illustrates a top view of a connector 110 with connector pins 140 in a toe-routing configuration, according to certain embodiments. In some embodiments, the receptacle 116 is configured to receive a first component 120A, such as an add-in card.

FIG. 2D illustrates a bottom view of a connector 110 with connector pins 140 in a toe-routing configuration, according to certain embodiments. The connector pins 140A are oriented toward the connector pins 140B to couple to the PCB 130 in a toe-routing configuration and the connector pins 140B are oriented away from the connector pins 140A to couple to the PCB 130 in the toe-routing configuration.

Figure 2E:
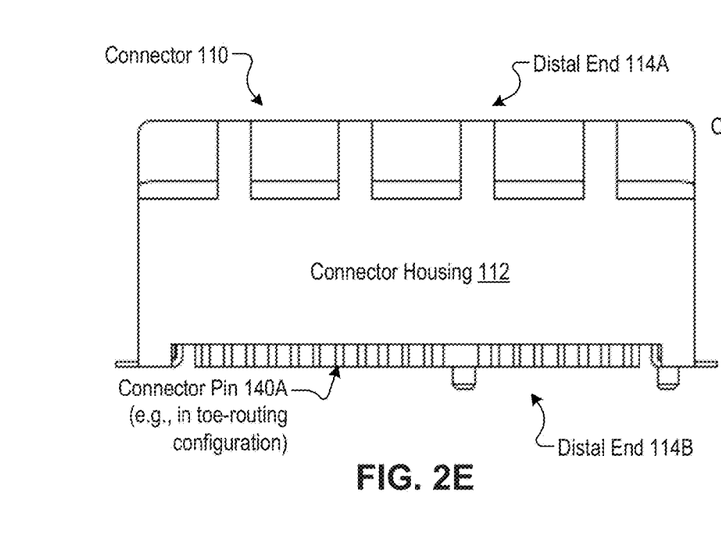
FIG. 2E illustrates a side view of a connector with connector pins in a toe-routing configuration, according to certain embodiments.

FIG. 2E illustrates a side view of a connector 110 with connector pins 140 in a toe-routing configuration, according to certain embodiments. The connector pins 140A are oriented toward the connector pins 140B to couple to the PCB 130 in a toe-routing configuration.

Figure 2F:
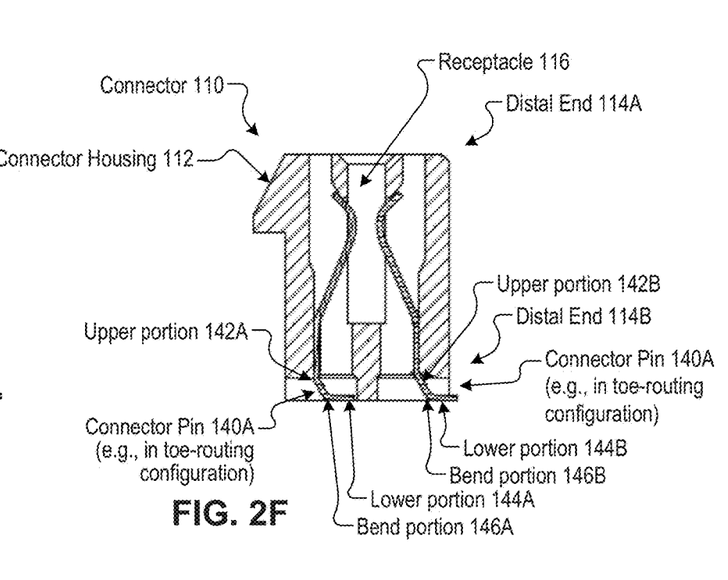
FIG. 2F illustrates a front cross-sectional view of a connector with connector pins in a toe-routing configuration, according to certain embodiments.

FIG. 2F illustrates a front cross-sectional view of a connector 110 with connector pins 140 in a toe-routing configuration, according to certain embodiments. Each connector pin 140 is oriented from the receptacle 116 to couple to the PCB 130. In some embodiments, the lower portion 144 is configured to be coupled to a solder pad 132 disposed on the PCB 130 and the upper portion 142 is configured to couple to a first component 120A (e.g., add-in card) when the first component 120A is inserted into the receptacle 116. The upper portion 142 extends from the receptacle 116 (e.g., proximate the first distal end 114A of the connector housing 112) to exit the connector housing 112 at the second distal end 114B of the connector housing 112. The bend portion 146 is disposed between the upper portion 142 and the lower portion 144.

Figure 3A:
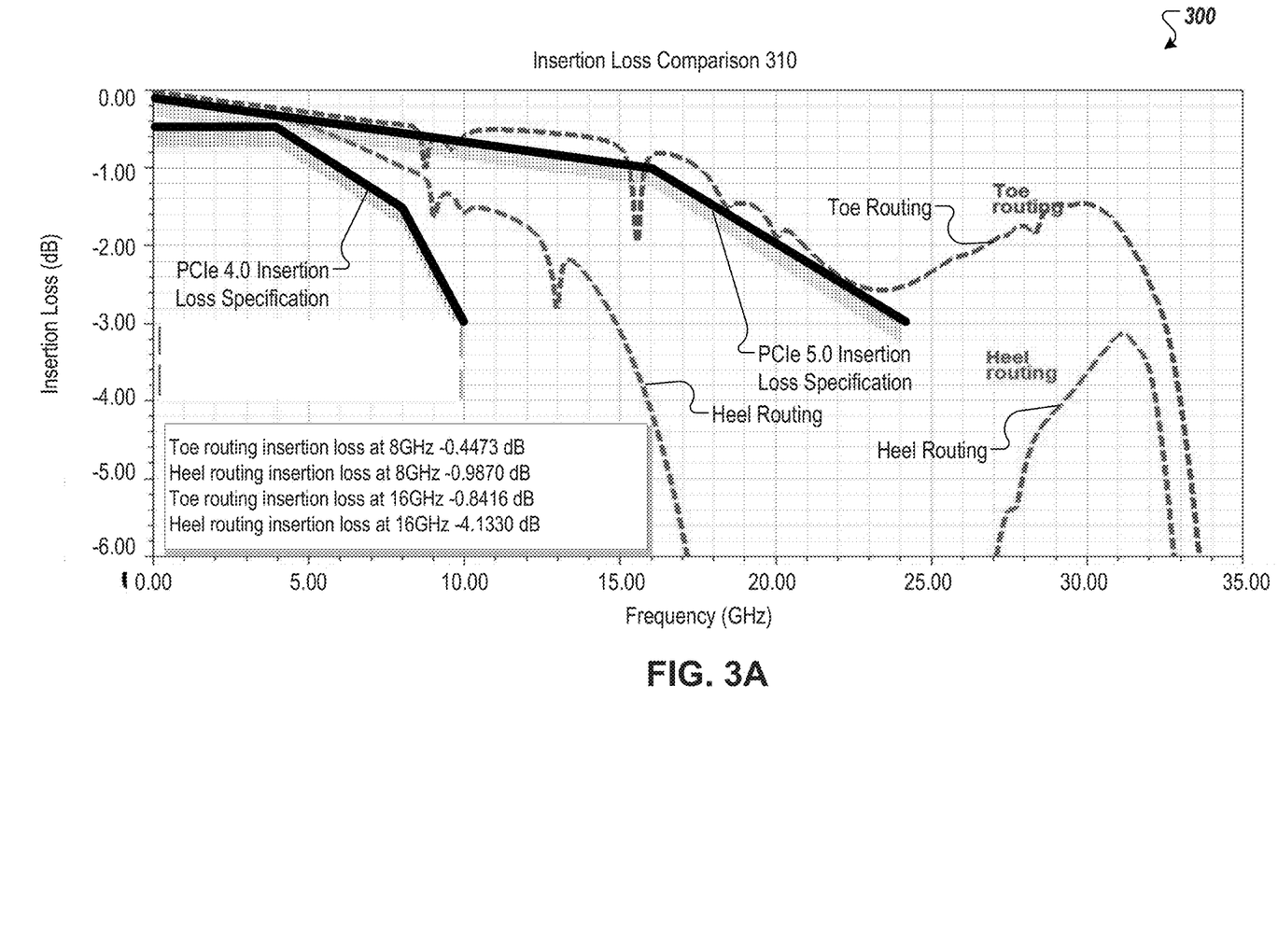
FIGS. 3A-C are graphs that illustrate a comparison between a connector that has connector pins in a toe-routing configuration and a connector that has connector pins in a heel-routing configuration, according to certain embodiments.
Figure 3B:
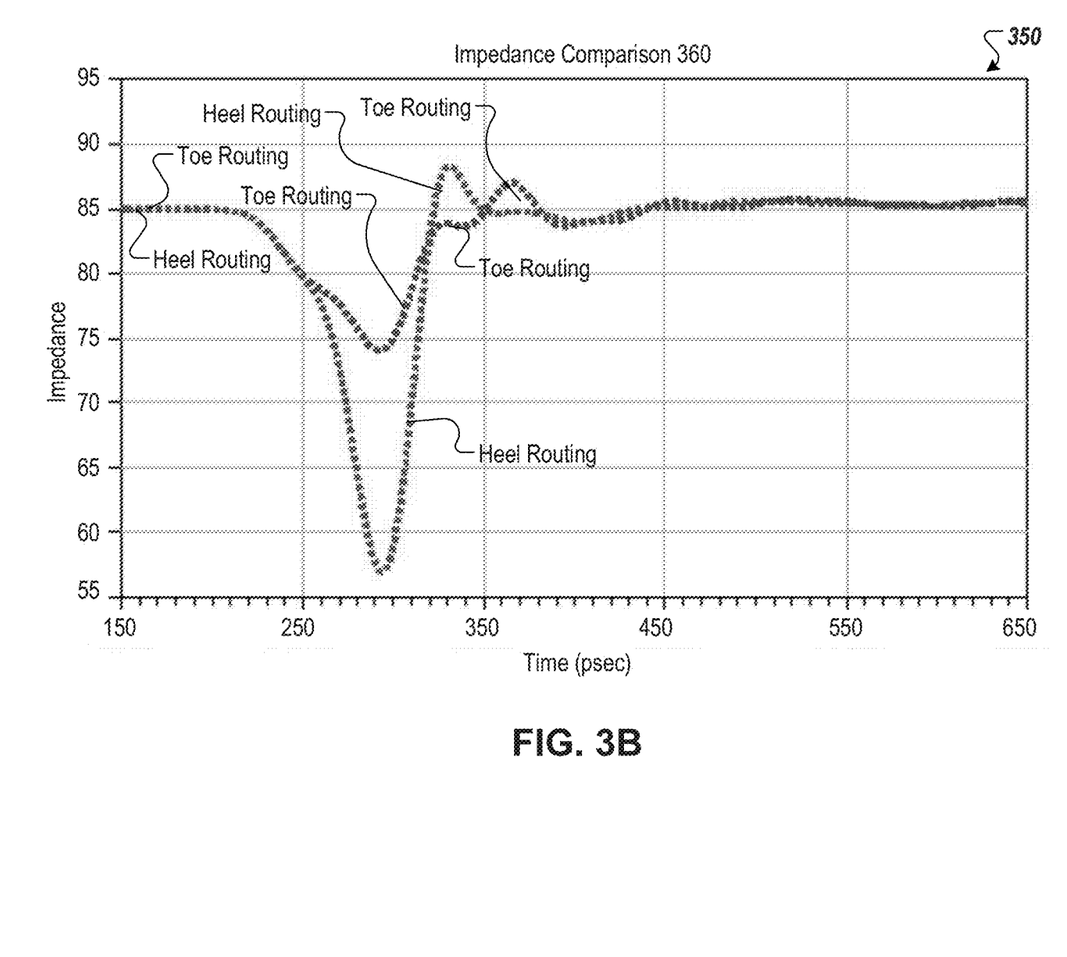
Figure 3C:
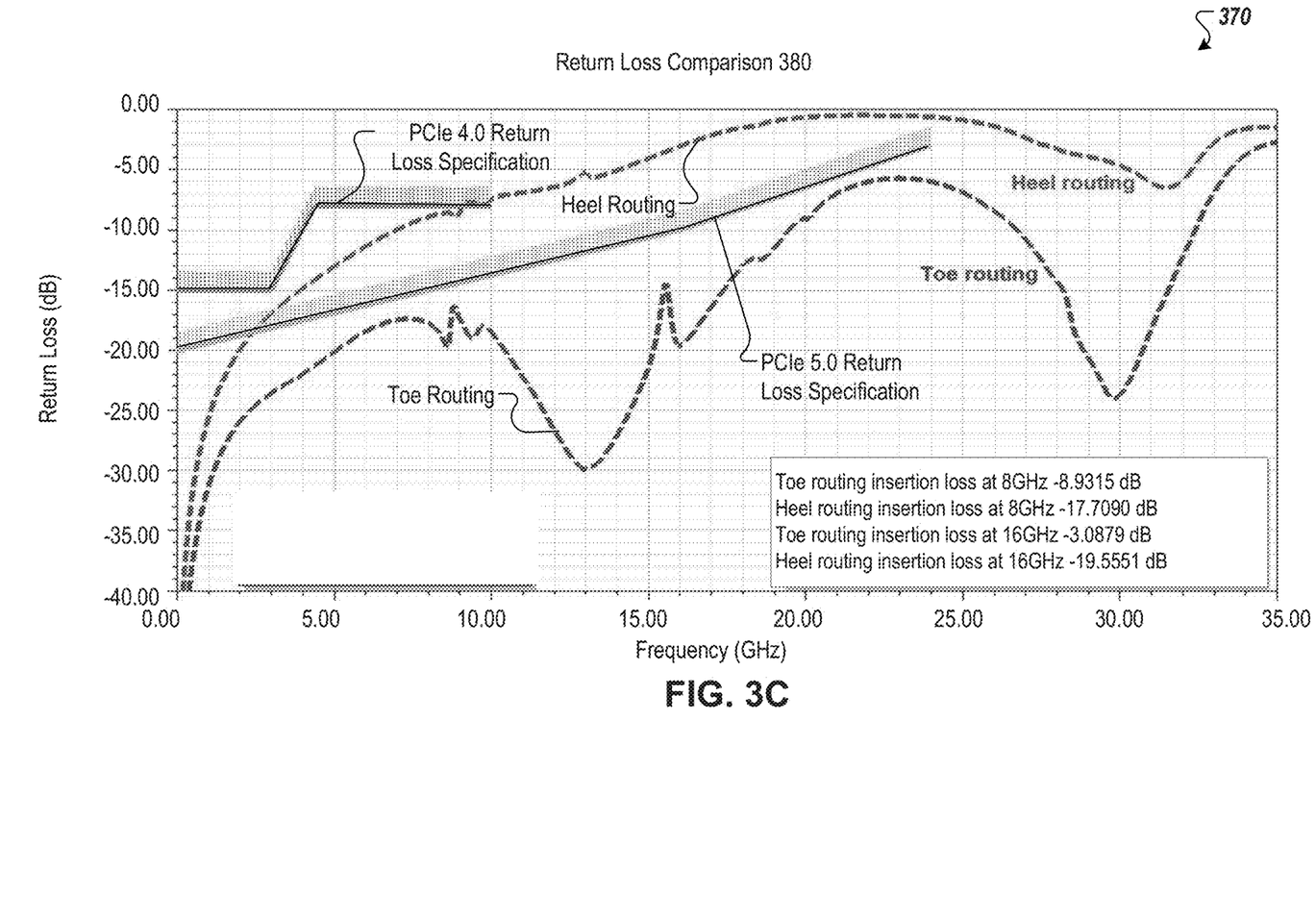

FIGS. 3A-C are graphs that illustrate a comparison between a connector pin in a heel-routing configuration and a connector pin in a toe-routing configuration, according to certain embodiments. In some embodiments, the designs of the pin shapes, lead-in trace, add-in card, etc. of the connector pins (e.g., connector pin in a toe-routing configuration and the connector pin in a heel-routing configuration) are identical and only the routing direction of the lead-in traces are different.

FIG. 3A is a graph 300 that illustrates an insertion loss comparison 310 of a connector pin in a heel-routing configuration and a connector pin in a toe-routing configuration (e.g., connector when the lead-in traces on the PCB are in a toe-routing configuration), according to certain embodiments. Graph 300 displays specification for insertion loss (e.g., PCIe® Gen4 and Gen5 Rev. 0.7 CEM connector IL limits). As illustrated in graph 300, a connector pin in heel-routing configuration does not meet the PCIe® 5.0 insertion loss specification by around 5 GHz, whereas a connector pin in a toe-routing configuration meets the PCIe® 5.0 insertion loss specification beyond 15 GHz (e.g., with a narrow excursion). The IL delta between the connector pin in a toe-routing configuration and the connector pin in a heel-routing configuration is significant along the higher frequency (e.g., 0.4 dB at 8 GHz and 2.1 dB at 16 GHz). The impact of the lead-in direction toward/out from the heel side is so significant, making it not allowable for PCIe® Gen5 signaling.

FIG. 3B is a graph 350 that illustrates an impedance comparison 360 of a connector pin in a heel-routing configuration and a connector pin in a toe-routing configuration, according to certain embodiments. In some embodiments, the impedances are plotted for toe and heel routings from time domain reflectometry (TDR) responses when a signal with rise time at 20 ps, 20-80% is utilized. As illustrated in graph 350, a connector pin in toe-routing configuration has a much less impedance drop than a connector pin in heel-routing configuration. The impedance delta at the connector foot is about 22 Ohms.

FIG. 3C is a graph 370 that illustrates a return loss comparison 380 of a connector pin in a heel-routing configuration and a connector pin in a toe-routing configuration, according to certain embodiments. As illustrated in graph 380, a connector pin in toe-routing configuration has a much less return loss than a connector pin in heel-routing configuration. The connector pin in toe-routing configuration meets the PCIe 5.0 return loss specification over a range of frequencies where the connector pin in heel-routing configuration does not meet the PCIe 5.0 return loss specification.

Figure 4:
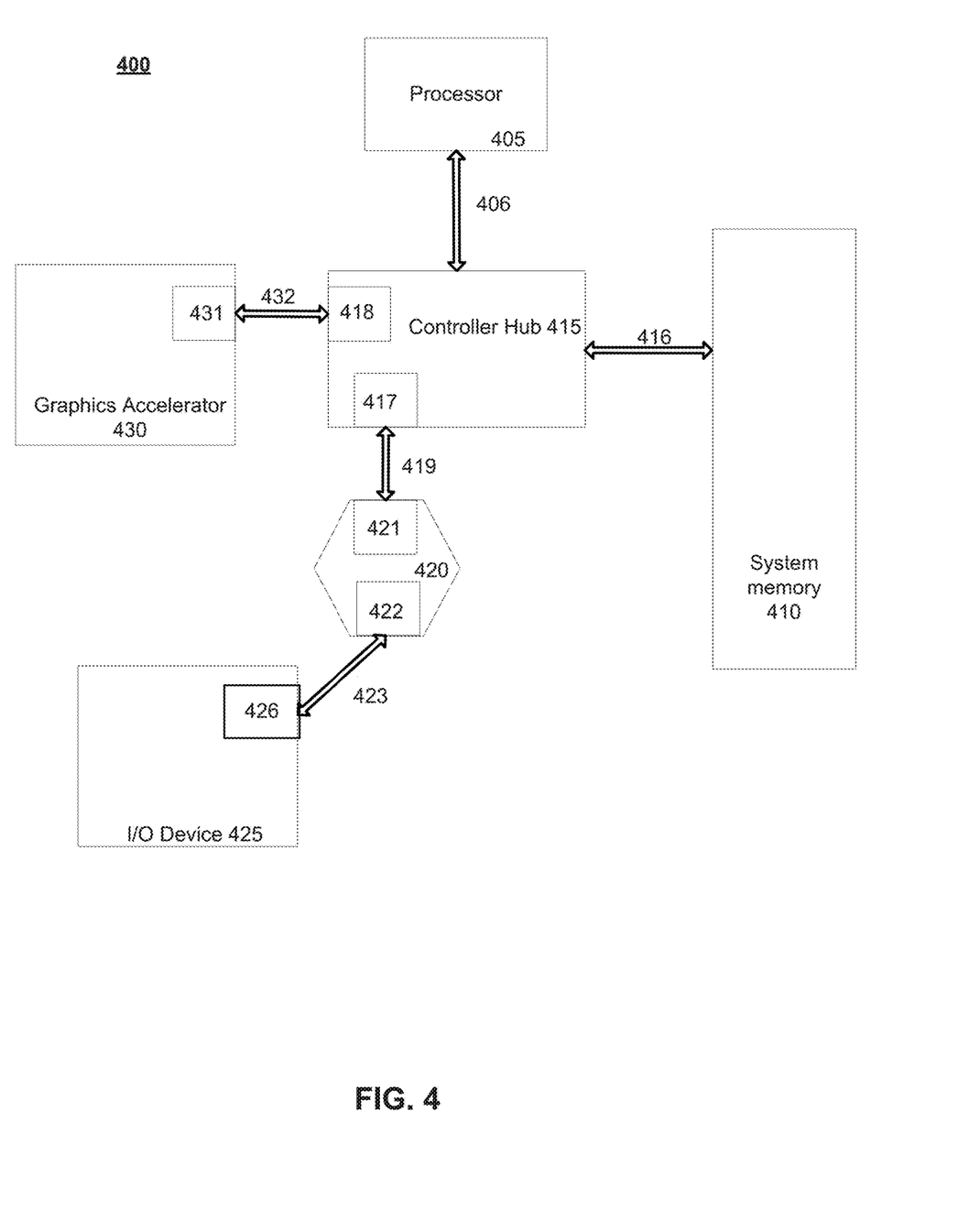
FIG. 4 illustrates a computer system with multiple interconnects, according to certain embodiments.

FIG. 4 illustrates a computer system 400 with multiple interconnects, according to certain embodiments. System 400 includes processor 405 and system memory 410 coupled to controller hub 415. Processor 405 includes any processing element, such as a microprocessor, a host processor, an embedded processor, a co-processor, or other processor. Processor 405 is coupled to controller hub 415 through front-side bus (FSB) 406. In one embodiment, FSB 406 is a serial point-to-point interconnect as described below. In another embodiment, FSB 406 (e.g., link) includes a serial, differential interconnect architecture that is compliant with different interconnect standards.

System memory 410 includes any memory device, such as random access memory (RAM), non-volatile (NV) memory, or other memory accessible by devices in system 400. System memory 410 is coupled to controller hub 415 through memory interface 416. Examples of a memory interface include a DDR memory interface, a dual-channel DDR memory interface, and a dynamic RAM (DRAM) memory interface.

In one embodiment, controller hub 415 is a root hub, root complex, or root controller. Examples of controller hub 415 include a chipset, a memory controller hub (MCH), a north bridge, an interconnect controller hub (ICH) a south bridge, and a root controller/hub. Often the term chipset refers to two physically separate controller hubs, i.e. a memory controller hub (MCH) coupled to an interconnect controller hub (ICH). Note that current systems often include the MCH integrated with processor 405, while controller 415 is to communicate with I/O devices, in a similar manner as described below. In some embodiments, peer-to-peer routing is optionally supported through root complex (e.g., controller 415).

Here, controller hub 415 is coupled to switch/bridge 420 through serial link 419. Input/output modules 417 and 421, which may also be referred to as interfaces/ports 417 and 421, include/implement a layered protocol stack to provide communication between controller hub 415 and switch 420. In one embodiment, multiple devices are capable of being coupled to switch 420.

Switch/bridge 420 routes packets/messages from device 425 upstream, i.e. up a hierarchy towards a root complex, to controller hub 415 and downstream, i.e. down a hierarchy away from a root controller, from processor 405 or system memory 410 to device 425. Switch 420, in one embodiment, is referred to as a logical assembly of multiple virtual PCI-to-PCI bridge devices. Device 425 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Fire wire device, a Universal Serial Bus (USB) device, a scanner, and other input/output devices. Often in the PCIe® vernacular, such as device, is referred to as an endpoint. Although not specifically shown, device 425 may include a PCIe® to PCI/PCI-X bridge to support legacy or other version PCI devices. Endpoint devices in PCIe® are often classified as legacy, PCIe®, or root complex integrated endpoints.

Graphics accelerator 430 is also coupled to controller hub 415 through serial link 432. In one embodiment, graphics accelerator 430 is coupled to an MCH, which is coupled to an ICH. Switch 420, and accordingly I/O device 425, is then coupled to the ICH. I/O modules 431 and 418 are also to implement a layered protocol stack to communicate between graphics accelerator 430 and controller hub 415. Similar to the MCH discussion above, a graphics controller or the graphics accelerator 430 itself may be integrated in processor 405.

I/O device 425 includes an interface 426 and switch/bridge 420 includes an interface 422. Interface 426 is coupled to interface 422 via serial link 423.

In one embodiment, short range wireless engines including a WLAN unit and a Bluetooth® unit may couple to processor 405 via an interconnect according to a PCIe® protocol, e.g., in accordance with the PCI Express® Specification Base Specification version 3.0 (published Jan. 17, 2004), or another such protocol such as a serial data input/output (SDIO) standard. Of course, the actual physical connection between these peripheral devices, which may be configured on one or more add-in cards, can be by way of the NGFF connectors adapted to a motherboard. Using WLAN unit, Wi-Fi® communications in accordance with a given Institute of Electrical and Electronics Engineers (IEEE) 802.11 standard can be realized, while via a unit using the Bluetooth® technology, short range communications via a Bluetooth® protocol can occur. In another embodiment, these units may communicate with processor 405 via, e.g., a USB link or a universal asynchronous receiver transmitter (UART) link.

One or more of the components of system 400 may be coupled by a connector 110 that has connector pins 140 that are all in the toe-routing configuration as described herein. For example, one or more of FSB 406, memory interface 416, serial link 419, serial link 423, or serial link 432 may include one or more connectors 110 that have connector pins 140 that are all in the toe-routing configuration.

Figure 5:
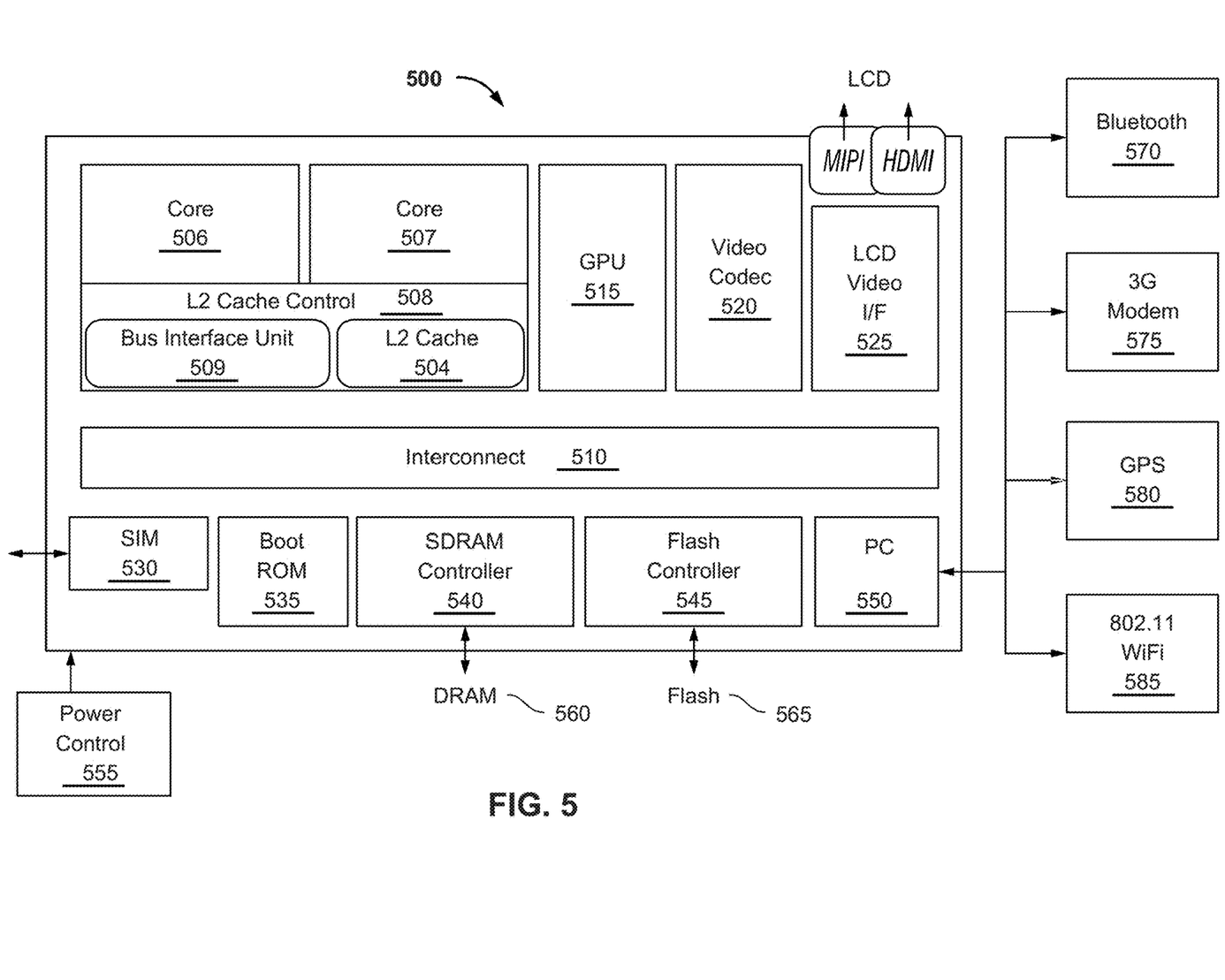
FIG. 5 illustrates a system on a chip (SOC) design, according to certain embodiments.

Turning next to FIG. 5, an embodiment of a system on-chip (SOC) design in accordance with the disclosures is depicted. As a specific illustrative example, SOC 500 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 500 includes 2 cores-506 and 507. Similar to the discussion above, cores 506 and 507 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 506 and 507 are coupled to cache control 508 that is associated with bus interface unit 509 and L2 cache 504 to communicate with other parts of system 500. Interconnect 510 includes an on-chip interconnect, such as an IOSF, AMBA, or other interconnect discussed above, which potentially implements one or more aspects of the described disclosure.

Interconnect 510 (e.g., interface) provides communication channels to the other components, such as a Subscriber Identity Module (SIM) 530 to interface with a SIM card, a boot ROM 535 to hold boot code for execution by cores 506 and 507 to initialize and boot SOC 500, a SDRAM controller 540 to interface with external memory (e.g. DRAM 560), a flash controller 545 to interface with non-volatile memory (e.g. Flash 565), a peripheral control 550 (e.g. Serial Peripheral Interface) to interface with peripherals, video codecs 520 and Video interface 525 to display and receive input (e.g. touch enabled input), GPU 515 to perform graphics related computations, etc. Any of these interfaces may incorporate aspects of the disclosure described herein.

In some embodiments, interconnect 510 may include one or more connectors 110 that have connector pins 140 that are all in the toe-routing configuration as described herein. Interconnect 510 may include connector 110 that has connector pins 140 that are all in the toe-routing configuration to couple one or more components of SOC 500.

In addition, the system illustrates peripherals for communication, such as a Bluetooth® module 570, 3G modem 575, GPS 585, and Wi-Fi® 585. Note as stated above, a UE includes a radio for communication. As a result, these peripheral communication modules are not all required. However, in a UE some form a radio for external communication is to be included. The SOC 500 may be coupled to the peripherals via a connector 110 that has connector pins 140 that are all in the toe-routing configuration as described herein.

The following examples pertain to further embodiments.

Example 1 is a connector comprising: a connector housing forming a receptacle configured to receive an add-in card; a first connector pin configured to electrically couple to the add-in card responsive to the add-in card being inserted into the receptacle, wherein the first connector pin extends from the connector housing to contact a first solder pad disposed on a printed circuit board (PCB); and a second connector pin configured to electrically couple to the add-in card responsive to the add-in card being inserted into the receptacle, wherein the second connector pin extends from the connector housing to contact a second solder pad disposed on the PCB, wherein the first connector pin is oriented toward the second connector pin to couple to the PCB in a toe-routing configuration and the second connector pin is oriented away from the first connector pin to couple to the PCB in the toe-routing configuration.

In Example 2, the subject matter of Example 1, wherein the first connector pin comprises: an upper portion oriented from the connector housing toward the first solder pad; a lower portion disposed on the first solder pad; and a bend portion disposed between the upper portion and the lower portion.

In Example 3, the subject matter of any one of Examples 1-2, wherein: the lower portion extends from a first location proximate a first distal end of the first solder pad to a second location proximate a second distal end of the first solder pad; the bend portion is proximate the first distal end of the first solder pad; and a first microstrip contacts the first solder pad proximate the second distal end of the first solder pad.

In Example 4, the subject matter of any one of Examples 1-3, wherein each connector pin of the connector is to couple to the PCB in the toe-routing configuration.

In Example 5, the subject matter of any one of Examples 1-4, wherein the first connector pin and the second connector pin in the toe-routing configuration has a less impedance drop, improved resonating characteristics, and an improved signal integrity (SI) compared to connectors in heel-routing configuration.

In Example 6, the subject matter of any one of Examples 1-5, wherein each of the first connector pin and the second connector pin has a pad stub length of less than 0.4 millimeters.

In Example 7, the subject matter of any one of Examples 1-6, wherein each of the first connector pin and the second connector pin has an insertion loss (IL) of up to 1.5 decibels (dB) at up to 16 Gigahertz (GHz).

In Example 8, the subject matter of any one of Examples 1-7, wherein each of the first connector pin and the second connector pin is configured for high-speed input-output (IO) channel signaling.

In Example 9, the subject matter of any one of Examples 1-8, wherein the connector is configured to transmit signals via Peripheral Component Interconnect Express® (PCIe®) protocol.

In Example 10, the subject matter of any one of Examples 1-9, wherein a first distal end of the first solder pad is disposed proximate an edge of the PCB, and wherein a microstrip couples to a second distal end of the first solder pad that is opposite the first distal end of the first solder pad.

Example 11 is a system comprising: a first component; a second component disposed on a printed circuit board (PCB); and a connector comprising: a connector housing forming a receptacle configured to receive the first component; a first connector pin configured to electrically couple to the first component responsive to the first component being inserted into the receptacle, wherein the first connector pin extends from the connector housing to contact a first solder pad disposed on the PCB, wherein the first solder pad is electrically coupled to the second component; and a second connector pin configured to electrically couple to the first component responsive to the first component being inserted into the receptacle, wherein the second connector pin extends from the connector housing to contact a second solder pad disposed on the PCB, wherein the second solder pad is electrically coupled to the second component, wherein the first connector pin is oriented toward the second connector pin to couple to the PCB in a toe-routing configuration and the second connector pin is oriented away from the first connector pin to couple to the PCB in the toe-routing configuration.

In Example 12, the subject matter of Example 11, wherein a first microstrip disposed on the PCB couples the first solder pad to the second component, and wherein a second microstrip disposed on the PCB couples the second solder pad to the second component.

In Example 13, the subject matter of any one of Examples 11-12, wherein the first connector pin comprises: an upper portion oriented from the connector housing toward the first solder pad; a lower portion disposed on the first solder pad; and a bend portion disposed between the upper portion and the lower portion.

In Example 14, the subject matter of any one of Examples 11-13, wherein: the lower portion extends from a first location proximate a first distal end of the first solder pad to a second location proximate a second distal end of the first solder pad; the bend portion is proximate the first distal end of the first solder pad; and a first microstrip contacts the first solder pad proximate the second distal end of the first solder pad.

In Example 15, the subject matter of any one of Examples 11-14, wherein each connector pin of the connector to couple to the PCB in the toe-routing configuration.

Example 16 is an interconnect assembly comprising: a housing comprising a first distal end to couple to a first component and a second distal end to be disposed proximate a printed circuit board (PCB); a first connector pin disposed partially within the housing, the first connector pin to couple to a first contact pad of the first component located at the first distal end and to contact a first solder pad disposed on the PCB proximate the second distal end; and a second connector pin disposed partially within the housing, the second connector pin to couple to a second contact pad of the first component located at the first distal end and to contact a second solder pad disposed on the PCB proximate the second distal end, wherein the first connector pin is oriented toward the second connector pin to couple to the PCB in a toe-routing configuration and the second connector pin is oriented away from the first connector pin to couple to the PCB in the toe-routing configuration.

In Example 17, the subject matter of Example 16, wherein a first microstrip disposed on the PCB couples the first solder pad to a second component disposed on the PCB, and wherein a second microstrip disposed on the PCB couples the second solder pad to the second component.

In Example 18, the subject matter of any one of Examples 16-17, wherein the first connector pin comprises: an upper portion oriented from the housing toward the first solder pad; a lower portion disposed on the first solder pad; and a bend portion disposed between the upper portion and the lower portion.

In Example 19, the subject matter of any one of Examples 16-18, wherein: the lower portion extends from a first location proximate a first solder pad distal end of the first solder pad to a second location proximate a second solder pad distal end of the first solder pad; the bend portion is proximate the first solder pad distal end of the first solder pad; and a first microstrip contacts the first solder pad proximate the second solder pad distal end of the first solder pad.

In Example 20, the subject matter of any one of Examples 16-19, wherein each connector pin of the interconnect assembly is to couple to the PCB in the toe-routing configuration.

Various embodiments can have different combinations of the structural features described above. For instance, all optional features of the computing system described above can also be implemented with respect to the method or process described herein and specifics in the examples can be used anywhere in one or more embodiments.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler embodiments, specific expression of algorithms in code, specific power down and gating techniques/logic and other specific operational details of computer system have not been described in detail in order to avoid unnecessarily obscuring the present disclosure.

The embodiments may be described with reference to components in high speed I/O (HSIO) devices in specific integrated circuits, such as in computing platforms or microprocessors. The embodiments can also be applicable to other types of integrated circuits and programmable logic devices. For example, the disclosed embodiments are not limited to desktop computer systems or portable computers, such as the Intel® Ultrabooks™ computers, and can be also used in other devices, such as handheld devices, tablets, other thin notebooks, systems on a chip (SoC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. It is described that the system can be any kind of computer or embedded system. The disclosed embodiments can especially be used for low-end devices, like wearable devices (e.g., watches), electronic implants, sensory and control infrastructure devices, controllers, supervisory control and data acquisition (SCADA) systems, or the like. Moreover, the apparatuses, methods, and systems described herein are not limited to physical computing devices, but can also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Although the embodiments herein are described with reference to a processor, other embodiments are applicable to other types of integrated circuits and logic devices. Similar techniques and teachings of embodiments of the present disclosure can be applied to other types of circuits or semiconductor devices that can benefit from higher pipeline throughput and improved performance. The teachings of embodiments of the present disclosure are applicable to any processor or machine that performs data manipulations. However, the present disclosure is not limited to processors or machines that perform 512 bit, 256 bit, 128 bit, 64 bit, 32 bit, or 16 bit data operations and can be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible embodiments of embodiments of the present disclosure.

A module as used herein refers to any combination of hardware, software, and/or firmware. As an example, a module includes hardware, such as a microcontroller, associated with a non-transitory medium to store code adapted to be executed by the microcontroller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) can refer to the combination of the microcontroller and the non-transitory medium. Often module boundaries that are illustrated as separate commonly vary and potentially overlap. For example, a first and a second module can share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate can provide a 0 or a 1 during operation. But a logic gate 'configured to' provide an enable signal to a clock does not include every potential logic gate that can provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics can be combined in any suitable manner in one or more embodiments.

In the foregoing specification, a detailed description has been given with reference to specific exemplary embodiments. It will, however, be evident that various modifications and changes can be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but can refer to different and distinct embodiments, as well as potentially the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "contacting," "coupling," "conducting," "transmitting," "receiving," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and can not necessarily have an ordinal meaning according to their numerical designation.

What is claimed is:

1. A connector comprising:
   a connector housing forming a receptacle configured to receive an add-in card;
   a first connector pin configured to electrically couple to the add-in card responsive to the add-in card being inserted into the receptacle, wherein the first connector pin extends from the connector housing to contact a first solder pad disposed on a printed circuit board (PCB); and
   a second connector pin configured to electrically couple to the add-in card responsive to the add-in card being inserted into the receptacle, wherein the second connector pin extends from the connector housing to contact a second solder pad disposed on the PCB, wherein the first connector pin is oriented toward the second connector pin to couple to the PCB in a toe-routing configuration and the second connector pin is oriented away from the first connector pin to couple to the PCB in the toe-routing configuration,
   wherein the first connector pin and the second connector pin in the toe-routing configuration have less impedance drop, improved resonating characteristics, and an improved signal integrity (SI) compared to connectors in heel-routing configuration.

2. The connector of claim 1, wherein the first connector pin comprises:
   an upper portion oriented from the connector housing toward the first solder pad;
   a lower portion disposed on the first solder pad; and
   a bend portion disposed between the upper portion and the lower portion.

3. The connector of claim 2, wherein:
   the lower portion extends from a first location proximate a first distal end of the first solder pad to a second location proximate a second distal end of the first solder pad;
   the bend portion is proximate the first distal end of the first solder pad; and
   a first microstrip contacts the first solder pad proximate the second distal end of the first solder pad.

4. The connector of claim 1, wherein each connector pin of the connector is to couple to the PCB in the toe-routing configuration.

5. The connector of claim 1, wherein each of the first connector pin and the second connector pin has a pad stub length of less than 0.4 millimeters.

6. The connector of claim 1, wherein each of the first connector pin and the second connector pin has an insertion loss (IL) of up to 1.5 decibels (dB) at up to 16 Gigahertz (GHz).

7. The connector of claim 1, wherein each of the first connector pin and the second connector pin is configured for high-speed input-output (TO) channel signaling.

8. The connector of claim 1, wherein the connector is configured to transmit signals via peripheral component interconnect express® (PCIe®) protocol.

9. The connector of claim 1, wherein a first distal end of the first solder pad is disposed proximate an edge of the PCB, and wherein a microstrip couples to a second distal end of the first solder pad that is opposite the first distal end of the first solder pad.

10. A system comprising:
   a first component;
   a second component disposed on a printed circuit board (PCB); and
   a connector comprising:
      a connector housing forming a receptacle configured to receive the first component;
      a first connector pin configured to electrically couple to the first component responsive to the first component being inserted into the receptacle, wherein the first connector pin extends from the connector housing to contact a first solder pad disposed on the PCB, wherein the first solder pad is electrically coupled to the second component; and
      a second connector pin configured to electrically couple to the first component responsive to the first component being inserted into the receptacle, wherein the second connector pin extends from the connector housing to contact a second solder pad disposed on the PCB, wherein the second solder pad is electrically coupled to the second component, wherein the first connector pin is oriented toward the second connector pin to couple to the PCB in a toe-routing configuration and the second connector pin is oriented away from the first connector pin to couple to the PCB in the toe-routing configuration,
      wherein a first microstrip disposed on the PCB couples the first solder pad to the second component, and wherein a second microstrip disposed on the PCB couples the second solder pad to the second component.

11. The system of claim 10, wherein the first connector pin comprises:
   an upper portion oriented from the connector housing toward the first solder pad;
   a lower portion disposed on the first solder pad; and
   a bend portion disposed between the upper portion and the lower portion.

12. The system of claim 11, wherein:
   the lower portion extends from a first location proximate a first distal end of the first solder pad to a second location proximate a second distal end of the first solder pad;
   the bend portion is proximate the first distal end of the first solder pad; and
   a first microstrip contacts the first solder pad proximate the second distal end of the first solder pad.

13. The system of claim 10, wherein each connector pin of the connector is to couple to the PCB in the toe-routing configuration.

14. An interconnect assembly comprising:
   a housing comprising a first distal end to couple to a first component and a second distal end to be disposed proximate a printed circuit board (PCB);
   a first connector pin disposed partially within the housing, the first connector pin to couple to a first contact pad of the first component located at the first distal end and to contact a first solder pad disposed on the PCB proximate the second distal end; and
   a second connector pin disposed partially within the housing, the second connector pin to couple to a second contact pad of the first component located at the first distal end and to contact a second solder pad disposed on the PCB proximate the second distal end, wherein the first connector pin is oriented toward the second connector pin to couple to the PCB in a toe-routing configuration and the second connector pin is oriented away from the first connector pin to couple to the PCB in the toe-routing configuration,
   wherein a first microstrip disposed on the PCB couples the first solder pad to a second, component disposed on the PCB, and wherein a second microstrip disposed on the PCB couples the second solder pad to the second component.

15. The interconnect assembly of claim 14, wherein the first connector pin comprises:
   an upper portion oriented from the housing toward the first solder pad;
   a lower portion disposed on the first solder pad; and
   a bend portion disposed between the upper portion and the lower portion.

16. The interconnect assembly of claim 15, wherein:
   the lower portion extends from a first location proximate a first solder pad distal end of the first solder pad to a second location proximate a second solder pad distal end of the first solder pad;
   the bend portion is proximate the first solder pad distal end of the first solder pad; and
   a first microstrip contacts the first solder pad proximate the second solder pad distal end of the first solder pad.

17. The interconnect assembly of claim 14, wherein each connector pin of the interconnect assembly is to couple to the PCB in the toe-routing configuration.

* * * * *

UNITED STATES PATENT AND TRADEMARK OFFICE
CERTIFICATE OF CORRECTION

PATENT NO. : 11,233,348 B2  
APPLICATION NO. : 16/857833  
DATED : January 25, 2022  
INVENTOR(S) : Se-Jung Moon et al.

Page 1 of 1

It is certified that error appears in the above-identified patent and that said Letters Patent is hereby corrected as shown below:

In the Claims

Column 16  
Line 62, "... (TO) channel" should read -- ... (IO) channel --

Signed and Sealed this  
First Day of October, 2024

Katherine Kelly Vidal  
*Director of the United States Patent and Trademark Office*